(12) United States Patent
Hong et al.

(10) Patent No.: US 8,980,732 B2
(45) Date of Patent: Mar. 17, 2015

(54) METHOD FOR MANUFACTURING SILICON CARBIDE SCHOTTKY BARRIER DIODE

(75) Inventors: Kyoung Kook Hong, Gyeonggi-do (KR); Jong Seok Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 462 days.

(21) Appl. No.: 13/372,931

(22) Filed: Feb. 14, 2012

(65) Prior Publication Data

US 2013/0115758 A1    May 9, 2013

(30) Foreign Application Priority Data

Nov. 7, 2011    (KR) .......................... 10-2011-0114977

(51) Int. Cl.
| | | |
|---|---|---|
| *H01L 21/02* | (2006.01) | |
| *H01L 27/082* | (2006.01) | |
| *H01L 29/872* | (2006.01) | |
| *H01L 29/66* | (2006.01) | |
| *H01L 21/04* | (2006.01) | |
| *H01L 29/16* | (2006.01) | |

(52) U.S. Cl.
CPC .......... *H01L 29/872* (2013.01); *H01L 29/6606* (2013.01); *H01L 21/046* (2013.01); *H01L 21/0495* (2013.01); *H01L 29/1608* (2013.01)
USPC ................... 438/534; 438/570; 257/E21.023; 257/E21.058; 257/E21.09; 257/E21.346; 257/E21.474

(58) Field of Classification Search
None
See application file for complete search history.

(56) References Cited

U.S. PATENT DOCUMENTS

| | | | |
|---|---|---|---|
| 6,737,677 B2 * | 5/2004 | Shimoida et al. ............... | 257/77 |
| 2008/0102582 A1 * | 5/2008 | Takei ............................. | 438/270 |
| 2009/0194809 A1 * | 8/2009 | Cho .............................. | 257/324 |

FOREIGN PATENT DOCUMENTS

| | | |
|---|---|---|
| JP | 09036393 A | 2/1997 |
| JP | 09064381 A | 3/1997 |
| JP | 2006253521 A | 9/2006 |
| JP | 2010114285 A | 5/2010 |
| KR | 10-2006-0081477 | 7/2006 |
| KR | 10-0861472 | 9/2008 |

* cited by examiner

*Primary Examiner* — Calvin Choi
(74) *Attorney, Agent, or Firm* — Mintz Levin Cohn Ferris Glovsky and Popeo, P.C.; Peter F. Corless

(57) ABSTRACT

The present invention provides a method for manufacturing a silicon carbide Schottky barrier diode. In the method, an n− epitaxial layer is deposited on an n+ substrate. A sacrificial oxide film is formed on the n− epitaxial layer by heat treatment, and then a portion where a composite oxide film is to be formed is exposed by etching. Nitrogen is implanted into the n− epitaxial layer and the sacrificial oxide film using nitrogen plasma. A silicon nitride is deposited on the n− epitaxial layer and the sacrificial oxide film. The silicon nitride is thermally oxidized to form a composite oxide film. An oxide film in a portion where a Schottky metal is to be deposited is etched, and then the Schottky metal is deposited, thereby forming a silicon carbide Schottky barrier diode.

19 Claims, 9 Drawing Sheets

METHOD FOR MANUFACTURING SILICON CARBIDE SCHOTTKY BARRIER DIODE

CROSS-REFERENCE TO RELATED APPLICATION

This application claims under 35 U.S.C. §119(a) the benefit of Korean Patent Application No. 10-2011-0114977, filed Nov. 7, 2011, the entire contents of which are incorporated herein by reference.

BACKGROUND (a) Technical Field

The present invention relates to a method of manufacturing a silicon carbide (SiC) Schottky barrier diode (SBD). More particularly, it relates to a method of manufacturing a SiC Schottky barrier diode with an improved breakdown voltage.

(b) Background Art

A Schottky diode is a special type of diode formed by the junction between an n-type semiconductor and a metal, which is named after the German physicist, Walter H. Schottky, who discovered the Schottky barrier.

A Schottky diode has a low forward voltage drop of about 0.2V to about 0.4V, and a switching speed that is 10 times faster than that of a typical diode. A low forward voltage drop produces a low heating value, better power efficiency, and low distortion of an input signal in terms of signal rectification and switching. Fast switching speed correlates to a short recovery time, which relates to how quickly a signal is sent in a forward direction when changing from reverse bias to forward bias.

Accordingly, since Schottky diodes can increase efficiency, they are widely used in fields that require faster switches/rectifiers such as, for example, high-frequency signal processing or power source circuits.

A disadvantage of a Schottky diode is that an electrical field is concentrated at the edge portion of an electrode; consequently, it is not possible to obtain a withstanding voltage as high as the theoretical yield value predicted for a silicon carbide (SiC) device.

Several methods have been attempted to address this disadvantage, including: a field plate structure in which an insulation film such as an oxide is used at the termination of the electrode, a field limiting ring structure that disperses a concentrated electric field, or a junction termination extension structure, all of which may be applied to mitigate the electric field crowding and achieve a device breakdown voltage value closer to the theoretical yield value. Of these methods, the field plate structure has been most widely used as a termination structure for improving the device breakdown voltage because it is simple and inexpensive to manufacture.

In order to use a field plate structure successfully, it is important to form a high quality oxide film having a sufficient thickness. Two methods may be used to produce such an oxide film: high-temperature thermal oxidation and chemical-vapor deposition (CVD). When high-temperature thermal oxidation is used to form an oxide film, the growth rate of the oxide film may be slow, making it difficult to form an oxide film of sufficient thickness. As a result of this limitation, the CVD process is generally used to form a thick oxide film. Unfortunately, the CVD process produces an oxide film having a lower film quality than an oxide film formed by thermal oxidation, which results in a diode with poor breakdown characteristics, and significant current leakage current, making it difficult to manufacture a commercially viable Schottky Barrier Diode (SBD) device using the field plate structure.

In view of the foregoing, there is a need for a technology that will facilitate production of a commercially viable Schottky Barrier Diode for power applications.

SUMMARY OF THE DISCLOSURE

The present invention provides a method for manufacturing a silicon carbide Schottky barrier diode, which can reduce current leakage and improve the breakdown voltage of the diode by virtue of increasing the thickness and quality of the oxide film. The method provides a high quality film of sufficient thickness to provide a suitable breakdown voltage by applying a composite oxide film formed using thermal oxidation after double pre-processing of nitrogen implantation and silicon nitride (SiNx) deposition to a termination of an electrode with a field plate structure.

In one aspect, the present invention provides a method for manufacturing a silicon carbide Schottky barrier diode, including: depositing an n− epitaxial layer on an n+ substrate; forming a sacrificial oxide film on the n− epitaxial layer by heat treatment, and then exposing a portion of the surface where a composite oxide film is to be formed by etching; implanting nitrogen into the n− epitaxial layer and the sacrificial oxide film using nitrogen plasma; depositing a silicon nitride on the nitrogen implanted n− epitaxial layer and the sacrificial oxide film; heat-oxidizing the silicon nitride to form a composite oxide film; and etching a portion of the oxide film on which a Schottky metal is to be deposited, and then depositing the Schottky metal.

In an exemplary embodiment, the method may further comprise performing an annealing process in a gas atmosphere after deposition of the Schottky metal, thereby improving the quality of the oxide film quality and the interface between the wafer and the oxide layer.

Other aspects and exemplary embodiments of the invention are discussed infra.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
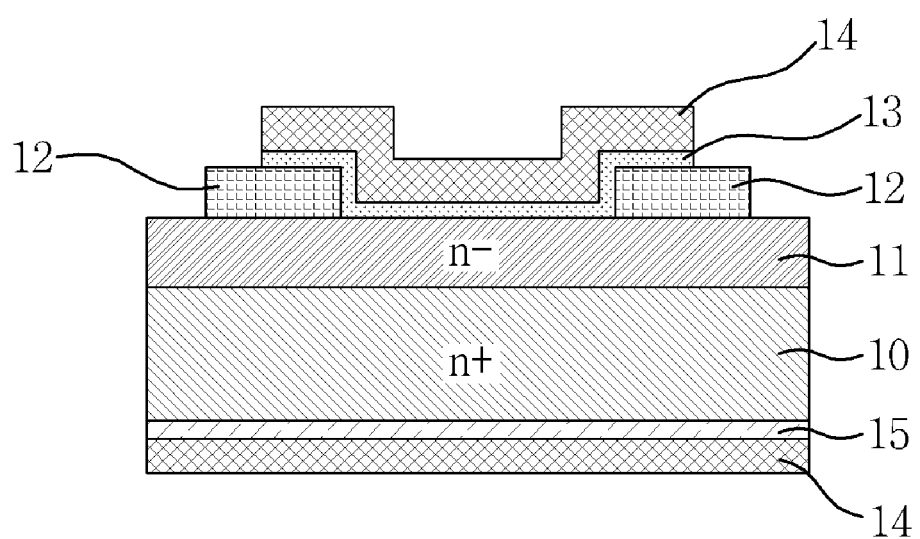
FIG. 1 is a cross-sectional view illustrating a structure of a Schottky barrier diode according to an embodiment of the present invention.

Reference numerals set forth in the Drawings includes reference to the following elements as further discussed below:

| | |
|---|---|
| 10: n+ substrate | 11: n− epitaxial layer |
| 12: composite oxide film | 13: Schottky meta |
| 14: pad metal | 15: ohmic metal |
| 16: sacrificial oxide film | 17: SiNx |

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Ranges provided herein are understood to be shorthand for all of the values within the range. For example, a range of 1 to 50 is understood to include any number, combination of numbers, or sub-range from the group consisting of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50, as well as all intervening decimal values between the aforementioned integers such as, for example, 1.1, 1.2, 1.3, 1.4, 1.5, 1.6, 1.7, 1.8, and 1.9. With respect to sub-ranges, "nested sub-ranges" that extend from either end point of the range are specifically contemplated. For example, a nested sub-range of an exemplary range of 1 to 50 may comprise 1 to 10, 1 to 20, 1 to 30, and 1 to 40 in one direction, or 50 to 40, 50 to 30, 50 to 20, and 50 to 10 in the other direction.

FIG. 1 is a cross-sectional view illustrating a structure of a Schottky barrier diode according to an embodiment of the present invention.

The present invention provides a method for manufacturing a silicon carbide Schottky barrier diode, which can produce a device breakdown voltage approximate to the theoretical breakdown value with a field plate structure applied to a termination of an electrode, by using thermal oxidation to form an oxide film having a sufficient thickness and an excellent film quality.

A silicon carbide Schottky barrier diode according to an embodiment of the present invention may have a structure in which an n− epitaxial layer 11, a composite oxide film 12, and a Schottky metal 13 are sequentially stacked on an n+ substrate 10.

The composite oxide film 12 may protrude from both ends of the upper surface of the n− epitaxial layer 11, as illustrated in FIG. 1. The Schottky metal 13 may be deposited with a uniform thickness over the composite oxide film 12 and the n− epitaxial layer 11.

Hereinafter, a method for manufacturing a silicon carbide Schottky barrier diode having such a structure will be described with reference to the accompanying drawings.

Figure 2:
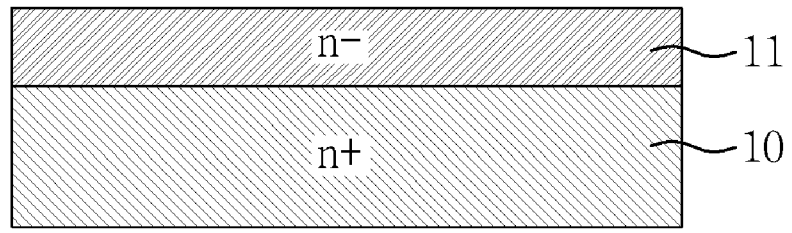
FIGS. 2 through 7 are cross-sectional views illustrating a method for manufacturing a Schottky barrier diode according to an embodiment of the present invention.

FIG. 2 is a cross-sectional view of a wafer, which represents the starting point for the process of manufacturing a device according to the invention.

Figure 3:
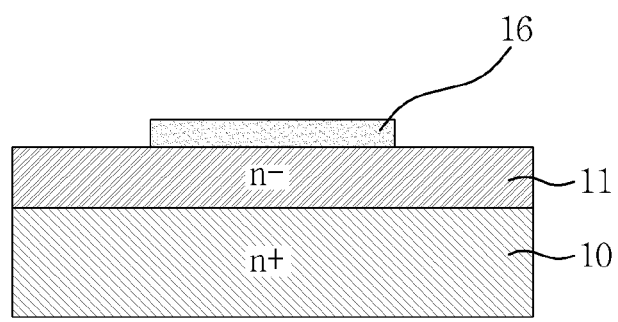

FIG. 3 is a cross-sectional view illustrating an exposed portion adjacent to a sacrificial oxide film 16, which defines the area where the composite oxide film 12 is to be formed by etching.

Figure 4:
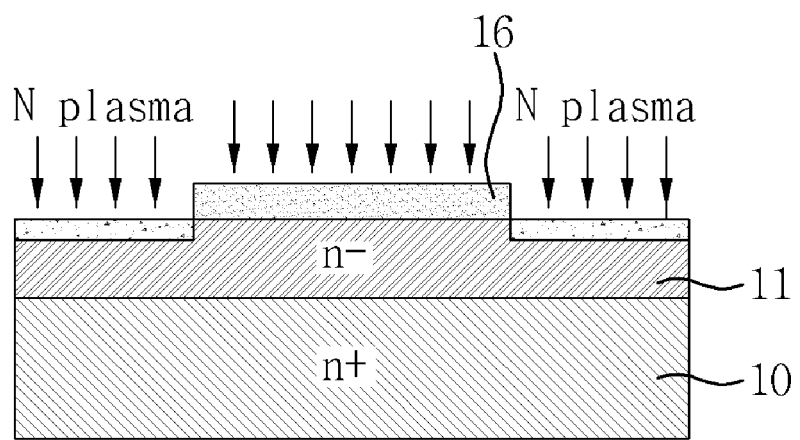

FIG. 4 is a cross-sectional view illustrating implantation of nitrogen into the n− epitaxial layer 11 and the sacrificial oxide film 16, through the use of, for example, nitrogen plasma.

Figure 5:
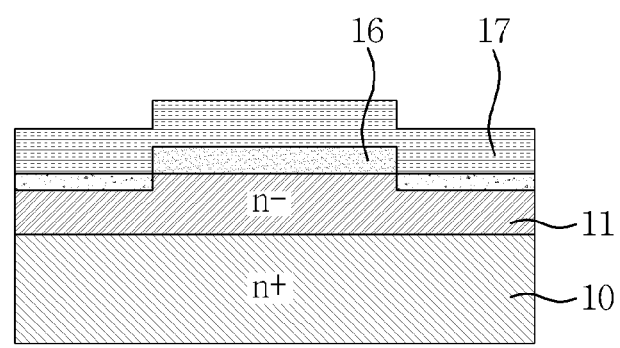

FIG. 5 is a cross-sectional view illustrating the deposition of silicon nitride (SiNx) 17.

Figure 6:
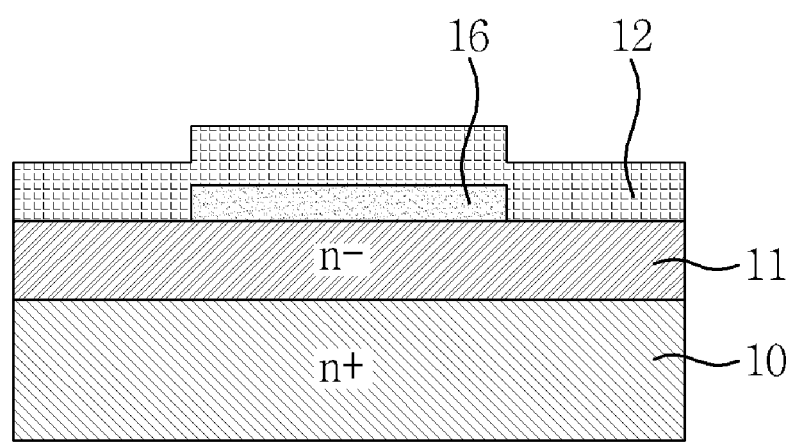

FIG. 6 is a cross-sectional view illustrating the composite oxide film 12 formed by thermal oxidation.

Figure 7:
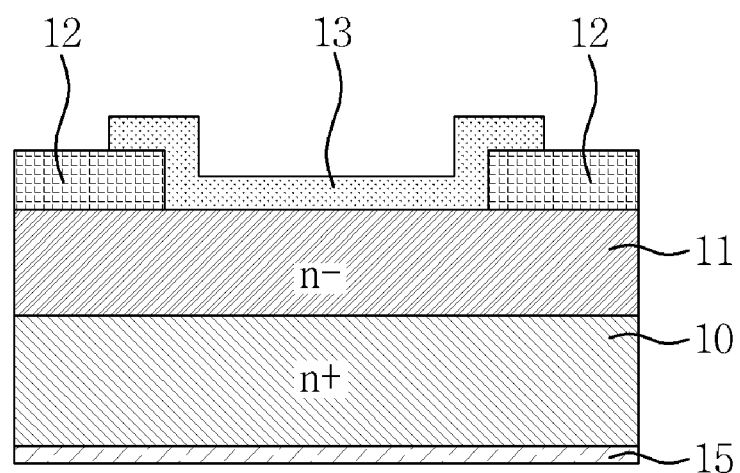

FIG. 7 is a cross-sectional view illustrating an ohmic metal 15 disposed under the wafer 10 and a Schottky metal 13 deposited on top of the n− epitaxial layer 11, and located within the region previously occupied by the sacrificial oxide film 16.

As shown in FIG. 2, the wafer prior to the manufacture of the device may be formed by depositing the n− epitaxial layer 11 on the n+ substrate 10. In this case, the n− doping concentration may range from about $10^{15}/cm^3$ to about $10^{16}/cm^3$.

As shown in FIG. 3, the sacrificial oxide film 16 may be formed through heat treatment to remove any defects and/or contamination on the surface of the wafer prior to the manufacture of the device, and then the portion of the n− epitaxial layer 11 where the composite oxide film 12 is to be formed may be exposed by etching.

Next, as shown in FIG. 4, nitrogen may be implanted with nitrogen plasma into the sacrificial oxide film 16, and the region of the n− epitaxial layer 11 exposed by etching. The nitrogen implantation may be performed using, e.g., a plasma chemical vapor deposition apparatus.

Thereafter, as shown in FIG. 5, a SiNx 17 may be deposited on the sacrificial oxide film 16, and the n− epitaxial layer 11 implanted with nitrogen using a chemical vapor deposition apparatus.

Next, as shown in FIG. 6, the composite oxide film 12 may be formed by thermal oxidation. The composite oxide film 12 may be formed in a dry or wet manner. Additionally, the quality of the oxide film and the interface between the wafer and the oxide film may be improved through annealing under an atmosphere of, e.g., nitrogen gas. Additionally, an oxide film may be deposited to improve the withstanding voltage characteristics.

An ohmic metal 15 may be deposited under the wafer, and the oxide film may be etched to create the region where the Schottky metal 13 is to be deposited, as shown in FIG. 7. Once the sacrificial oxide film 16 has been etched, a metal for Schottky junction may be deposited upon both the composite oxide film 12 and the etched n− epitaxial layer 11.

In an embodiment of the invention, the Schottky metal 13 may include titanium (Ti), and the ohmic metal 15 may include nickel (Ni). Heat treatment may be performed to achieve the characteristics of each metal.

Finally, as shown in FIG. 1, a metal pad 14 may be deposited under the ohmic metal 15 and on the Schottky metal 13.

According to the invention, the growth rate of the oxide film can be increased by implanting nitrogen into the surface of the SiC wafer using nitrogen plasma, and then depositing the silicon nitride 17 and forming the composite oxide film 12 through thermal oxidation, and the breakdown voltage can be improved by improving the oxide breakdown voltage.

The composite oxide film 12 formed through thermal oxidation and gas heat treatment after double heat treatment of nitrogen plasma and thin film deposition of the silicon nitride 17 was applied to a termination of an electrode with a field plate structure. Hereinafter, the results of the test to verify the effect of the present invention will be described.

Test Examples

Figure 8:
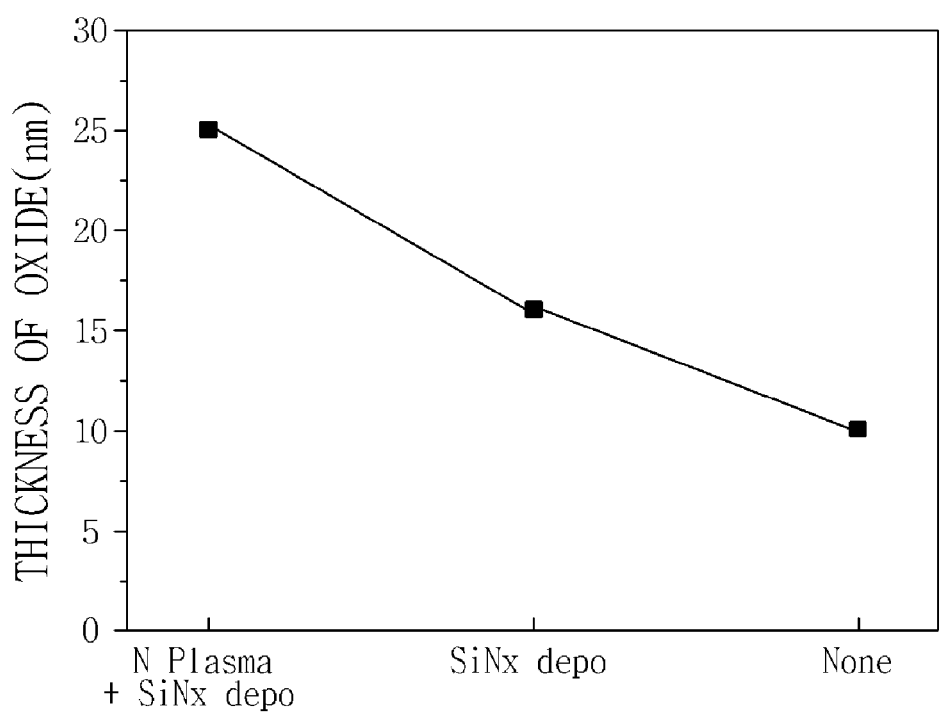
FIG. 8 is a graph illustrating the thickness of a composite oxide film according to an embodiment of the present invention and the thickness of a typical composite oxide film.
Figure 9:
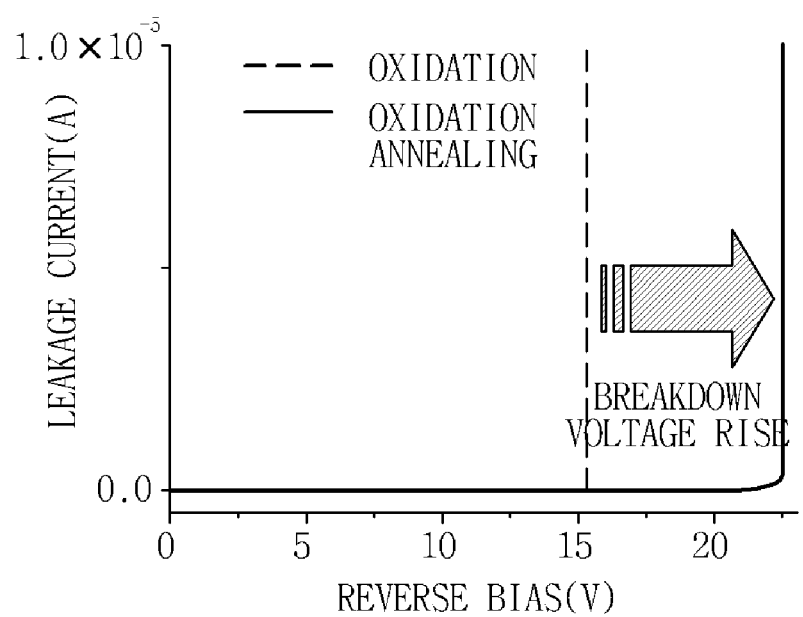
FIG. 9 is a graph illustrating the breakdown voltage characteristics before and after annealing after a composite oxide film is formed according to an embodiment of the present invention.

FIG. 8 is a graph showing the thickness of a composite oxide film according to an embodiment of the present invention and a typical composite oxide film. FIG. 9 is a graph showing the breakdown voltage characteristics before and after annealing of a composite oxide film layer according to an embodiment of the present invention.

Wet oxidation was performed at a temperature of about 1,080° C. for about 2 hours on three samples: 1) On the first sample (Embodiment), nitrogen plasma was implanted into the surface of a SiC wafer and then SiNx 17 was deposited; 2) on the second sample (Comparative Example 1), only SiNx 17 was deposited without implantation of nitrogen plasma; and 3) on the third sample (Comparative Example 2), neither nitrogen implantation nor deposition of SiNx 17 was performed. Thereafter, the thicknesses of the three oxide film layers formed was measured.

Subsequently, as shown in FIG. 8, in the case where both nitrogen (N) plasma implantation and SiNx 17 deposition were performed, the thickness of the SiNO composite oxide film 12 was grown to about 25 nm, and the thickness thereof was about 2.5 times greater than that of a typical dry oxidation method (Comparative Example 2) in which double pre-processing was not performed, and the growth rate of the oxide film increased about 150% at a given temperature.

Also, the composite oxide film 12 that is formed by thermal oxidation can improve the quality of the oxide film and the defect of the interface between the wafer and the oxide film by annealing at an atmosphere of, e.g., nitrogen gas.

In order to verify such an effect, the breakdown voltage of the oxide film was measured before and after performing one-hour annealing at a nitrogen atmosphere at about 1,000° C. on the composite oxide film 12 that was formed by the method according to the embodiment of the present invention. As shown in FIG. 9, the breakdown voltage before oxidation and annealing was about 15.3V, but increased to about 23V after annealing.

In the case where the composite oxide film 12 is formed by the method according to the embodiment of the present invention, a test for measuring a breakdown field was performed to verify the excellence of the film quality. Three samples were prepared and tested. For the first sample, dry oxidation followed by heat treatment in a nitrogen atmosphere was performed on one sample (Embodiment) in which nitrogen plasma was implanted into the surface of a SiC wafer and then SiNx 17 was deposited. The second sample was similarly tested, however, for this sample (Comparative Example 1), only SiNx 17 was deposited without implantation of nitrogen plasma. The third sample was similarly tested, however this sample (Comparative Example 2) was not subjected to either nitrogen implantation or deposition of SiNx 17. The results of measurement of the breakdown voltage and the breakdown field are shown in Table 1 below.

TABLE 1

|  | N plasma + SiNx depo. | SiNx depo. | None |
|---|---|---|---|
| Breakdown Voltage (V) | 23.0 | 14.2 | 9.4 |
| Breakdown Field (MV/cm) | 9.2 | 8.9 | 9.4 |

As shown in Table 1, the breakdown voltage of the composite oxide film 12 according to the embodiment of the present invention was much higher than that of typical dry oxidation, and the breakdown field also indicated excellence of the film quality.

A method for manufacturing a silicon carbide Schottky barrier diode according to an embodiment of the present invention has the following advantage. The breakdown voltage of a diode can be improved due to increase of the growth rate of an oxide film and improvement of the oxide breakdown voltage, by depositing a silicon nitride and forming a composite oxide film through thermal oxidation after implanting nitrogen into the surface of a SiC wafer using nitrogen plasma.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A method for manufacturing a silicon carbide Schottky barrier diode, comprising:
    depositing an n− epitaxial layer on an n+ substrate;
    protecting a first portion of the n− epitaxial layer with a sacrificial oxide film layer;
    etching a second portion of the n− epitaxial layer that is not protected by the sacrificial oxide film;
    implanting nitrogen into the second portion of the n− epitaxial layer and the sacrificial oxide film;
    depositing silicon nitride on the nitrogen implanted n− epitaxial layer and the sacrificial oxide film;
    heat-oxidizing the silicon nitride to form a composite oxide film;
    removing the sacrificial oxide film after etching a first portion of the composite oxide film formed on the sacrificial oxide film;
    depositing a Schottky metal so as to be disposed to cover the first portion of the n− epitaxial layer and at least a portion of a second portion of the composite oxide film formed on the second portion of the n− epitaxial layer; and
    depositing a metal pad on top of the Schottky metal;
    wherein the depositing of the Schottky metal is performed after etching the sacrificial oxide film and the first portion of the composite oxide film on which the Schottky metal is to be deposited.

2. The method of claim 1, further comprising annealing the composite oxide film in a gas atmosphere at a temperature of between about 500° C. and 1,500° C. before depositing the Schottky metal.

3. The method of claim 2, wherein the gas atmosphere is nitrogen.

4. The method of claim 2, wherein the temperature is 1,000° C.

5. The method of claim 1, wherein the first portion of the n-epitaxial layer is substantially centrally located within the n− epitaxial layer.

6. The method of claim 1, wherein the sacrificial oxide film layer is formed by heat treatment.

7. The method of claim 6, wherein the heat treatment is about 900° C. to about 1,200° C.

8. The method of claim 1, wherein the implanted nitrogen is provided in the form of nitrogen plasma.

9. The method of claim 1, wherein the sacrificial oxide film layer is removed by etching.

10. The method of claim 1, wherein the Schottky metal comprises titanium.

11. The method of claim 1, further comprising depositing an ohmic metal layer on the n+ substrate so that the ohmic metal layer is disposed on a side of the n+ substrate opposite from the n− epitaxial layer.

12. The method of claim 11, wherein the ohmic metal layer comprises nickel.

13. The method of claim 11, further comprising depositing a metal pad under the ohmic metal layer, or on top of the Schottky metal, or under the ohmic metal layer and on top of the Schottky metal.

14. The method of claim 1, wherein the Schottky metal is deposited with a uniform thickness.

15. The method of claim 1, wherein the n− epitaxial layer has a doping concentration that ranges from about $10^{15}/cm^3$ to about $10^{16}/cm^3$.

16. The method of claim 1, wherein the heat-oxidizing step is performed in a wet or dry manner.

17. The method of claim 1, wherein the heat-oxidizing step is performed in a dry manner at about 1,080° C.

18. A method of manufacturing a silicon carbide Schottky barrier diode, comprising:
   depositing an n− epitaxial layer on an n+ substrate;
   protecting a first portion of the n− epitaxial layer with a sacrificial oxide film layer, wherein the first portion of the n− epitaxial layer is substantially centrally located within the n− epitaxial layer and the n− epitaxial layer has a doping concentration of about $10^{15}/cm^3$ to about $10^{16}/cm^3$;
   etching a second portion of the n− epitaxial layer that is not protected by the sacrificial oxide film;
   implanting nitrogen into the second portion of the n− epitaxial layer and the sacrificial oxide film, wherein the nitrogen is provided in the form of nitrogen plasma;
   depositing silicon nitride on the nitrogen implanted n− epitaxial layer and the sacrificial oxide film;
   heat-oxidizing the silicon nitride to form a composite oxide film, wherein the heat-oxidizing step is performed in a dry manner at about 1,080° C.;
   removing the sacrificial oxide film after etching a first portion of the composite oxide film formed on the sacrificial oxide film;
   depositing a Schottky metal so as to be disposed to cover the first portion of the n− epitaxial layer and at least a portion of a second portion of the composite oxide film formed on the second portion of the n− epitaxial layer;
   depositing a metal pad on top of the Schottky metal, thereby producing a silicon carbide Schottky barrier diode; and
   annealing the composite oxide film in a gas atmosphere at a temperature of between about 900° C. and 1,200° C.,
   wherein the depositing of the Schottky metal is performed after etching the sacrificial oxide film and the first portion of the composite oxide film on which the Schottky metal is to be deposited.

19. A method for manufacturing a silicon carbide Schottky barrier diode, comprising:
   depositing an n− epitaxial layer on an n+ substrate;
   protecting a first portion of the n− epitaxial layer with a sacrificial oxide film layer;
   etching a second portion of the n− epitaxial layer that is not protected by the sacrificial oxide film;
   implanting nitrogen into the second portion of the n− epitaxial layer and the sacrificial oxide film;
   depositing silicon nitride on the nitrogen implanted n− epitaxial layer and the sacrificial oxide film;
   heat-oxidizing the silicon nitride to form a composite oxide film;
   removing the sacrificial oxide film after etching a first portion of the composite oxide film formed on the sacrificial oxide film; and
   depositing a Schottky metal so as to be disposed to cover the first portion of the n− epitaxial layer and at least a portion of a second portion of the composite oxide film formed on the second portion of the n− epitaxial layer; and
   depositing a metal pad on top of the Schottky metal;
   wherein the depositing of the Schottky metal is performed after etching the sacrificial oxide film and the first portion of the composite oxide film on which the Schottky metal is to be deposited so that the second portion of the composite oxide film is applied as an electric field plate structure at a termination of the Schottky metal.

* * * * *